(12) United States Patent
Liu et al.

(10) Patent No.: US 6,590,266 B1
(45) Date of Patent: Jul. 8, 2003

(54) 2-BIT MASK ROM DEVICE AND FABRICATION METHOD THEREOF

(75) Inventors: Mu-Yi Liu, Taichung (TW); Tso-Hung Fan, Taipei Hsien (TW); Kwang-Yang Chan, Hsinchu (TW); Yen-Hung Yeh, Taoyuan Hsien (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,906

(22) Filed: Aug. 28, 2002

(51) Int. Cl.[7] .................. H01L 29/94; H01L 31/062
(52) U.S. Cl. .................. 257/390; 257/391; 438/278
(58) Field of Search .................. 257/390, 391; 438/278

(56) References Cited

U.S. PATENT DOCUMENTS 6,087,699 A * 7/2000 Wann et al. .................. 257/384
6,458,642 B1 * 10/2002 Yeh et al. .................. 438/216

\* cited by examiner

Primary Examiner—Hoai Ho
Assistant Examiner—Tu-Tu Ho
(74) Attorney, Agent, or Firm—Jiang Chyun IP Office

(57) ABSTRACT

A 2-bit mask ROM device and a fabrication method thereof are described. The 2-bit mask ROM device includes a substrate; a gate structure, disposed on a part of the substrate; a 2-bit code region, configured in the substrate beside both sides of the gate structure; at least one spacer, disposed on both sides of the gate structure; a buried drain region, configured in the substrate beside both sides of the spacer; a doped region, configured in the substrate between the buried drain region and the 2-bit code region, wherein the dopant type of the doped region is different from that for the 2-bit code region and the dopant concentration in the doped region is higher than that in the 2-bit code region; an insulation layer, disposed above the buried drain region; and a word line disposed on the gate structures along a same row.

19 Claims, 4 Drawing Sheets

2-BIT MASK ROM DEVICE AND FABRICATION METHOD THEREOF

BACKGROUND OF INVENTION

1. Field of the Invention

The present invention relates to a mask read-only memory (ROM) device and a fabrication method thereof. More particularly, the present invention relates to a two-bit mask ROM device and a fabrication method thereof.

2. Description of Related Art

Mask ROM device is a very fundamental type of read-only memory devices, in which a photomask layer is used to define a connection between a metal line and a memory cell or an ion implantation process is used to adjust the threshold voltage to achieve the "on" and "off" state of the memory cell. When there are changes in the product of a mask ROM device, no dramatic modification is required by the manufacturing process. Only one set of photomask needs to be changed. Therefore, the mask ROM device is suitable for mass production. Actually, a portion of the manufacturing of the mask ROM device can be completed first. The programming of the device can be quickly performed soon after an order is placed to move up the delivery/shipping date.

Currently the two-bit mask ROM device is actively being developed. A two-bit mask ROM device obviously is a memory device wherein two bit of data are stored per a single cell. The structure of this type of memory device is described as follow.

FIG. 1 is a schematic cross sectional view of a conventional two bit mask read only memory (ROM) device.

Referring to FIG. 1, a conventional two bit mask read only memory device comprises a substrate 10, a gate structure 16, a two-bit code region 20, a buried drain region 18, an insulation layer 22 and a word line 24.

The gate structure 16 is disposed on a part of the substrate 10. The gate structure 16 comprises a gate conductive layer 14 and a gate oxide layer 12 disposed under the gate conductive layer 14. The buried drain region 18 is configured in the substrate 100 beside both sides of the gate structure 16.

Further, a two-bit code region 20 is configured in the substrate 10 besides both sides of the gate structure 16. The two-bit code region 20 that comprises code ions implanted therein corresponds to a logic state of "1", whereas the two-bit code region 20 that comprises no code ions implanted therein corresponds to a logic state of "0".

However, the buried drain region and the two-bit coding region of a conventional two-bit mask ROM device are connected together. Junction leakage is thus easily occurred. Moreover, the second bit effect is easily generated. Since the memory cell of a conventional mask ROM device is easily interfered by junction leakage of the neighboring memory cells and the second bit effect is often generated, the operation window is thus smaller for a conventional memory device.

SUMMARY OF INVENTION

According to the present invention, a two-bit mask ROM device and a fabrication method thereof are provided to eliminate the second bit effect in a two-bit mask ROM device.

The present invention further provides a two-bit mask ROM device and a fabrication method thereof, wherein an interference to the two-bit memory cell by junction leakage of other memory cells is prevented.

In accordance to the present invention, a two-bit mask ROM device is provided, which includes a substrate, a gate structure, a two-bit code region and at least a spacer, a buried drain region, a doped region, an insulation layer and a word line. The gate structure is disposed on a part of the substrate, wherein the gate structure includes a gate conductive layer and a gate oxide layer. The two-bit code region is disposed in the substrate beside both sides of the gate structure, wherein the two-bit code region having code ions implanted therein corresponds to a logic state of "1", while the two-bit code region having no code ions implanted therein corresponds to a logic state of "0". Further, a spacer is disposed on both sides of the gate structure and a buried drain region is configured in the substrate beside both sides of the spacer. A doped region is configured between the buried drain region and the 2 bit-code code region, wherein the doped region almost completely encloses the two-bit code region. In the present invention, the dopant type of the doped region is different form that of the of the two-bit code region. Further, the dopant concentration of the doped region is higher than the dopant concentration in the two-bit code region. Additionally, the insulation layer is disposed above the buried drain region, and the word line is disposed on the gate structures along a same row, wherein the word line includes a polysilicon layer and a metal silicide layer disposed on the polysoilicon layer.

The present invention provides a fabrication method for a two-bit mask ROM device, wherein a gate structure is formed on a substrate, and the gate structure comprises a gate conductive layer and a gate oxide layer underlying the gate conductive layer. Thereafter, a patterned photoresist layer is formed on the substrate, exposing a two-bit code region. A tilted code implantation is then performed to implant code ions in the 2-bit code region, using the photoresist layer as a code implantation mask. Thereafter, a first ion implantation is performed to form a doped region in the substrate using this photoresist layer as a mask, wherein the, dopant type of the doped region is different from that of the 2-bit code region. Moreover, the dopant concentration in the doped region is higher than the dopant concentration in the 2-bit code region. Thereafter, the photoresist layer is removed. At least one spacer is formed on the side of the gate structure. Using the gate structure and the spacer as an ion implantation mask, a second ion implantation is performed to form a buried drain region in the substrate beside the side of the spacer. A plurality of 2-bit code memory cells is thus formed. In each 2-bit code memory cell, the presence of the code ions implanted in the memory cell corresponds to a logic state of "1", while the absence of the code ions implanted in the memory cell corresponds to a logic state of "0". Further, an insulation layer is formed above the buried drain region, and a word line is formed above gate structures along a same row. The doped region of the present invention, after being subjected to a series of thermal process, almost completely encloses the two-bit code region.

According to the 2-bit mask ROM device and the fabrication method thereof of the present invention, the 2-bit code region is almost completely enclosed by the doped region. Interference between memory cells can be prevented.

The 2-bit code region of the 2-bit mask ROM device of the present invention is almost completely enclosed by a doped region having a dopant type different from that of the 2-bit code region and a dopant concentration higher than that of the 2-bit code region. Therefore, the second bit effect of the 2-bit mask ROM device can be eliminated by drain induced barrier lowering.

Since the two-bit memory cells of the 2-bit mask ROM device of the present invention do not interfered with each other, and the second-bit effect of the 2-bit mask ROM device can be eliminated by drain induced barrier lowering, the operational margin of the memory device is increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Detailed Description

FIGS. 2A to 2E are schematic, cross-sectional views illustrating the process flow for fabricating a 2-bit mask ROM memory device according to one aspect of the present invention.

Figure 1:
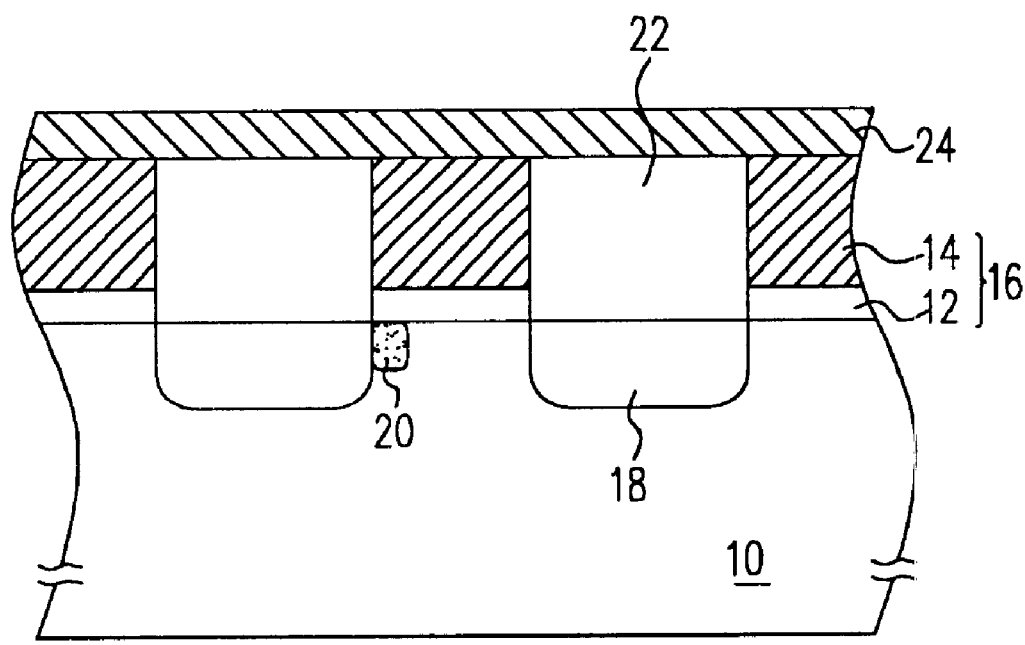
FIG. 1 is a schematic, cross-sectional view of a conventional 2-bit mask ROM device.
Figure 2A:
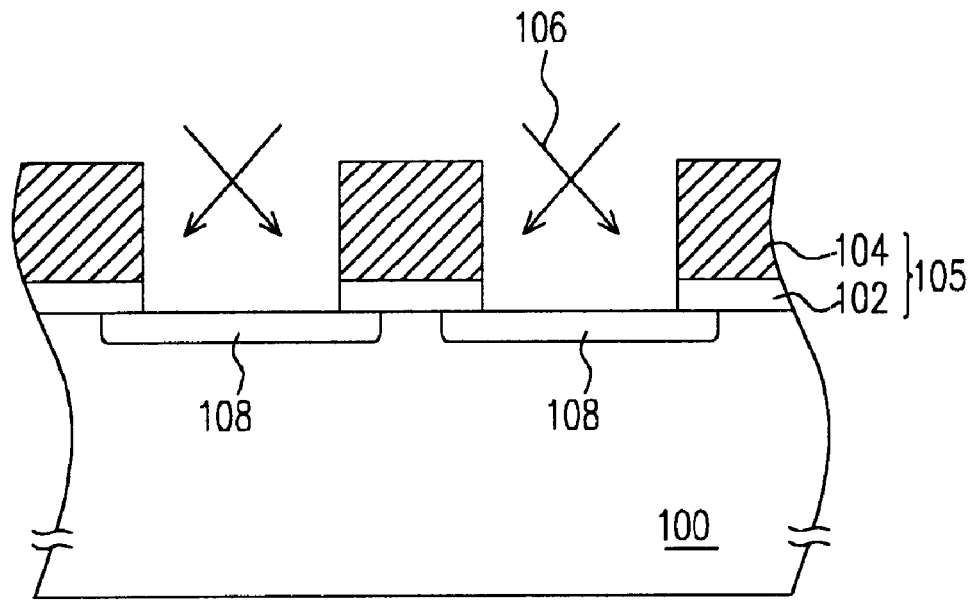
FIGS. 2A to 2E are schematic, cross-sectional views illustrating the process flow for fabricating a 2-bit mask ROM memory device according to one aspect of the present invention.

Referring to FIG. 2A, a gate structure 105 is provided on a substrate 100, wherein the gate structure 105 comprises a gate conductive layer 104 and a gate oxide layer 102 formed under the gate conductive layer 104. The gate conductive layer 104 is formed with a material comprising polysilicon. Further, the gate oxide layer 102 is about 45 angstroms thick.

Thereafter, a pocket ion implantation process 106 is performed to form a pocket doped region 108 in the substrate 100 beside the side of the gate structure 105. According to this aspect of the present invention, the ions implanted in the pocket doped region 108 comprises, for example, arsenic ions. The dosage of the pocket ion implantation process 106 is about $1 \times 10^{13}/cm^2$. The implantation energy for the pocket ion implantation process 106 is about 50 KeV and the tilt angle of the pocket ion implantation process 106 is about 45 degrees.

Figure 2B:
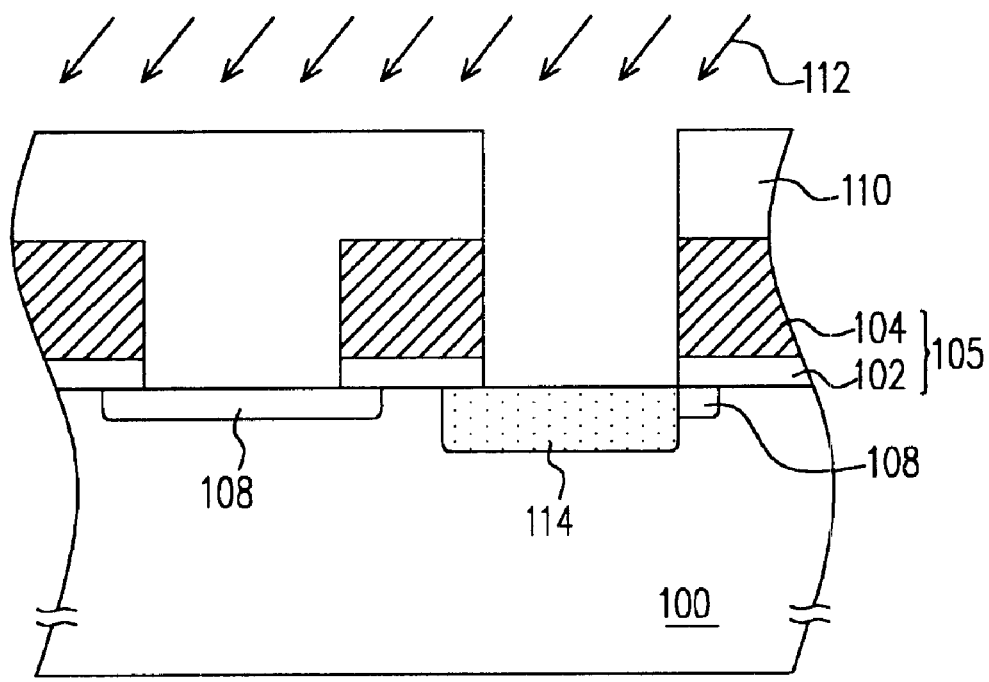

Referring to FIG. 2B a patterned photoresist layer 110 is formed on the substrate 100, exposing a 2-bit code region 114. Using the photoreist layer 110 as an implantation mask, a 2-bit code implantation process 112 is performed to implant code ions into the 2-bit code region 114. According to this aspect of the present invention, the code ions implanted into the 2-bit code region 114 include, for example, arsenic ions. The dosage of the 2-bit code implantation process 112 is about $2 \times 10^{13}/cm^2$. The implantation energy of the 2-bit code implantation process 112 is about 50 KeV and the tilt angle of the 2-bit code implantation process 112 is about 45 degrees.

According to this-aspect of the present invention, the 2-bit code region 114 is formed under both sides of the gate structure 105, wherein having code ions subsequently implanted in the 2-bit code region 114 corresponds to a logic state of "1" while having no code ions implanted in the 2-bit code region 114 corresponds to a logic state of "0". Since a pocket ion implantation 106 is already performed in the previous processing steps, the 2-bit code region that has no code ions implanted therein corresponds to the pocket doped region 108.

Figure 2C:
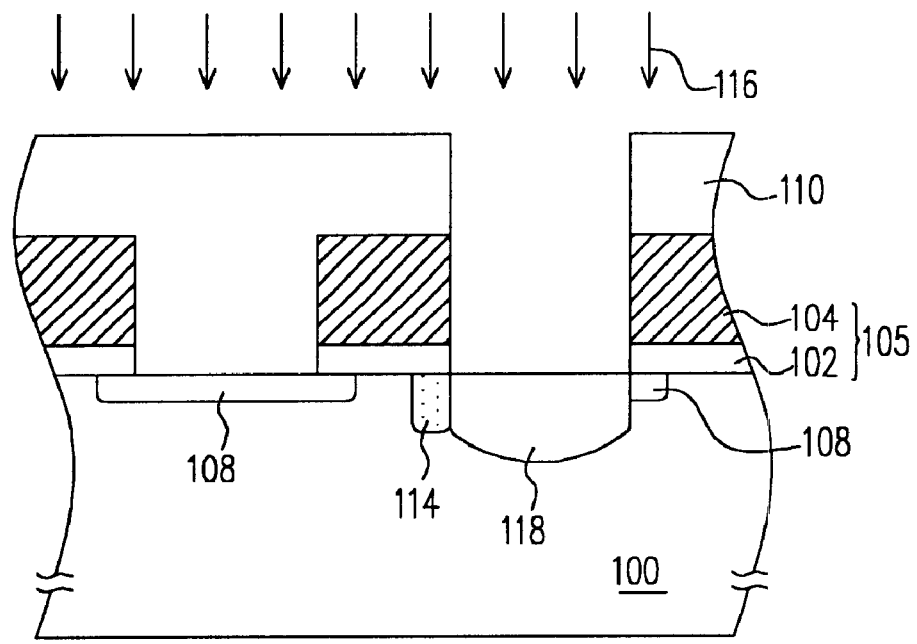

Continuing to FIG. 2C, further using the photoresist layer 110 as an implantation mask, a first ion implantation process 116 is performed to form a doped region 118 in the substrate 100, wherein the dopont type of the doped region 118 is different from the dopant type of the 2-bit code region 114. Further, the dopant concentration in the doped region 118 is higher than that in the 2-bit code region 114. In this aspect of the present invention, the ions implanted in the doped region 118 include $BF_2^+$ions. The dosage the first ion implantation process 116 is about $5 \times 10^{13}/cm^2$. The implantation energy of the first ion implantation process 116 is about 40 KeV.

Figure 2D:
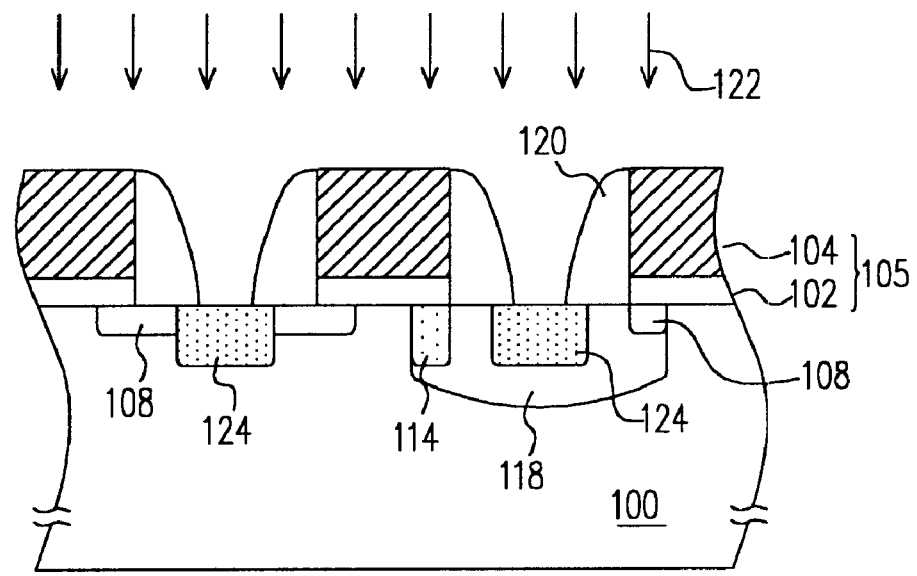

Continue to FIG. 2D, after the photoresist layer 110 is removed, at least one spacer 120 is formed on the side of the gate structure 105, wherein the spacer 120 is about 400 angstroms to 600 angstroms thick, preferably about 500 angstroms thick. The spacer 120 is formed with a material comprising, for example, silicon nitride or silicon oxide. The spacer 120 is formed by forming a conformal dielectric layer on the substrate 100, followed by back etching the dielectric layer.

Still referring to FIG. 2D, using the spacer 120 and gate structure 105 as an implantation mask, a second ion implantation process 122 is performed to form a buried drain region 124 in the substrate 100 beside the sides of the spacer 120. A plurality of code memory cells is thus formed, wherein the code memory cells that comprises the code ions implanted therein correspond to the logic state of "1" while the code memory cells that do not comprises the code ions implanted therein correspond to the logic state of "0". In the present aspect of the invention, the buried drain region is implanted with ions, such as, $BF_2^+$ions. Further, the dosage of the implanted dopants for the second ion implantation process 122 is about $1 \times 10^{15}/cm^2$ and the implantation energy of the second ion implantation process 122 is, for example, about 10 KeV.

Figure 2E:
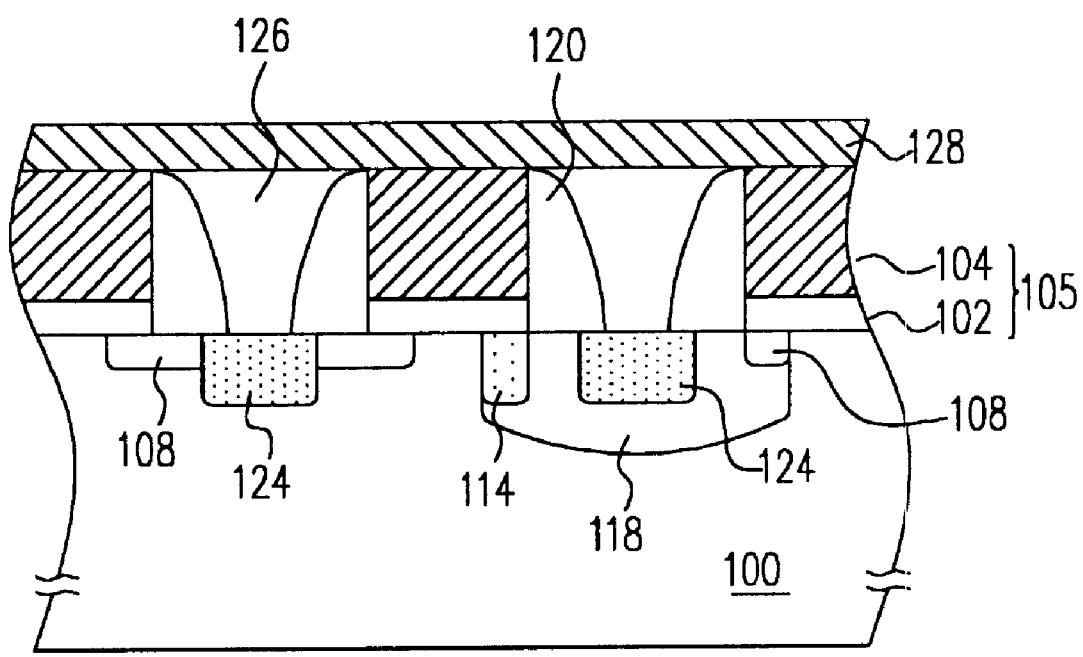

Referring to FIG. 2E, an insulation layer 126 is formed above the buried drain region 124 to isolate the two neighboring gate structures 105, wherein the insulation layer 126 comprises a material, such as, silicon oxide. The insulation layer 126 is formed by, for example, forming an insulation material layer on the substrate 100, covering the gate structures 105. Chemical mechanical polishing or back etching is further performed to remove a portion of the insulation layer until the gate structure 105 is exposed.

A word line 128 is further formed on the gate structures 105 to electrically connected the gate structures 105 along a same row. The word line comprises, for example, polysilicon. Further, the present invention comprises forming a metal silicide layer on the surface of the polysilicon type of word line 128 to lower the resistance of the word line 128.

One point that is worth noting is that the doped region 118 in the mask ROM device of the present invention, after being subjected to several thermal processes, almost completely encloses the two-bit code region 114. In other words, the 2-bit code region 114 is being enclosed by a doped region 118 that has a dopant type different from that of the 2-bit code region 114 and has a higher dopant concentration than that of the 2-bit code region 114. Consequently, the second bit effect of the 2-bit mask ROM device can be eliminated by drain induced barrier lowering. Interference between memory cells is reduced to increase the operational margin of the device.

In accordance to the present invention, the 2-bit mask ROM device and the fabrication method thereof prevents interference between memory cells.

Further, the 2-bit mask ROM device and the fabrication method thereof of the present invention can eliminate the second bit effect of the 2-bit mask ROM device.

Further, the 2-bit mask ROM device and the fabrication method thereof of the present invention can increase the operational margin of a memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A 2-bit mask ROM device, comprising:
   a substrate;
   a gate structure, disposed on a part on the substrate;
   a 2-bit code region, configured in the substrate beside both sides of the gate structure;
   at least a spacer, disposed on both sides of the gate structure;
   a buried drain region, configured in the substrate beside both sides of the spacer;
   a doped region, configured in the substrate between the buried drain region and the 2-bit code region, wherein a dopant type of the doped region is different from that of the 2-bit code region and a dopant concentration of the doped region is higher than a dopant concentration of the 2-bit code region;
   an insulation layer, disposed above the buried drain region; and
   a word line, disposed on a surface of the gate structure.

2. The 2-bit mask ROM device of claim 1, wherein the doped region encloses the 2-bit code region.

3. The 2-bit mask ROM device of claim 1 further comprising a pocket doped region, configured in the 2-bit code region that comprises no code ion implanted therein.

4. The 2-bit mask ROM device of claim 3, wherein dopants implanted in the pocket doped region includes arsenic ions and a dopant concentration in the pocket doped region is about $1 \times 10^{13}/cm^2$.

5. The 2-bit mask ROM device of claim 1, wherein dopants implanted in the 2-bit code region includes arsenic ions and a dopant concentration in the 2-bit code region is about $2 \times 10^{13}/cm^2$.

6. The method of claim 1, wherein dopants implanted in the doped region includes $BF_2^+$ and a dopant concentration implanted in the doped region is about $5 \times 10^{13}/cm^2$.

7. The method of claim 1, wherein dopants implanted in the buried drain region includes $BF_2^+$ and a dopant concentration in the buried drain region is about $1 \times 10^{15}/cm^2$.

8. The method of claim 1, wherein the spacer is about 400 angstroms to about 600 angstroms thick.

9. The method of claim 1, wherein the word line includes a polysilicon layer and a metal silicide layer on a top of the polysilicon layer.

10. A fabrication method for a mask ROM device, comprising:
    forming a gate structure on a substrate;
    forming a patterned photoresist layer on the substrate, wherein a 2-bit code region is exposed;
    performing a 2-bit code implantation process to implant code ions in the 2-bit code region using the photoresist layer as an implantation mask;
    performing a first ion implantation process to form a doped region in the substrate using the photoresist layer as the mask, wherein a dopant type of the doped region is different from that of the 2-bit code region and a dopant concentration of the doped region is higher than that of the 2-bit code region; removing the photoresist layer;
    forming at least a spacer on a sidewll of the gate structure;
    performing a second ion implantation process to form a buried drain region in the substrate beside both sides of the spacer using the spacer and the gate structure as a mask, wherein the buried drain region and the 2-bit code region further comprise the doped region therebetween;
    forming an insulation layer above the buried drain region;
    forming a word line on the gate structure.

11. The method of claim 10, wherein after being subjected to several thermal processes, the doped region encloses the 2-bit code region.

12. The method of claim 10, wherein after forming the gate structure, the method further comprises performing a pocket ion implantation process to form a pocket doped region in the substrate beside both sides of the gate structure.

13. The method of claim 12, wherein dopants implanted in the pocket doped region includes arsenic ions, a dopant concentration of the pocket ion implantation process is about $1 \times 10^{13}/cm^2$, an implantation energy of the pocket ion implantation process is about 50 KeV, and a tilt angle of the pocket ion implantation process is about 45 degrees.

14. The method of claim 10, wherein code ions used in the 2-bit code implantation process includes arsenic ions, a dopant concentration of the 2-bit code implantation process is about $2 \times 10^{13}/cm^2$, an implantation energy of the 2-bit code implantation is about 50 KeV, and a tilt angle of the 2-bit code implantation is about 45 degrees.

15. The method of claim 10, wherein ions implanted in the doped region includes $BF_2^+$ ions, a dopant concentration of the first ion implantation process is about $5 \times 10^{13}/cm^2$, and an implantation energy of the first ion implantation process is about 40 KeV.

16. The method of claim 10, wherein ions implanted in the buried drain region includes $BF_2^+$ ions, a dopant concentration of the second ion implantation process is about $1 \times 10^{15}/cm^2$, and an implantation energy of the second ion implantation process is about 10 KeV.

17. The method of claim 10, wherein forming the insulation layer comprises:
    forming an insulation material layer on the substrate, covering the gate structure; and
    removing a portion of the insulation material layer until the gate structure is exposed using a back etching method or a chemical mechanical method.

18. The method of claim 10, wherein the spacer is about 400 angstroms to 600 angstroms thick.

19. The method of claim 10, wherein forming the word line comprises:
    forming a polysilicon layer on the gate structure; and
    forming a metal suicide layer on a surface of the polysilicon layer.

* * * * *